(12) United States Patent
Chiang et al.

(10) Patent No.: US 11,342,015 B1
(45) Date of Patent: May 24, 2022

(54) MEMORY DEVICE AND MEMORY CIRCUIT

(71) Applicant: Taiwan Semiconductor Manufacturing Company, Ltd., Hsinchu (TW)

(72) Inventors: Hung-Li Chiang, Taipei (TW); Chung-Te Lin, Tainan (TW); Shy-Jay Lin, Hsinchu County (TW); Tzu-Chiang Chen, Hsinchu (TW); Ming-Yuan Song, Hsinchu (TW); Hon-Sum Philip Wong, Stanford, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/103,914

(22) Filed: Nov. 24, 2020

(51) Int. Cl.
   *G11C 11/16* (2006.01)
   *H01L 27/22* (2006.01)
   *G11C 11/18* (2006.01)

(52) U.S. Cl.
   CPC ...... *G11C 11/1659* (2013.01); *G11C 11/1673* (2013.01); *G11C 11/1675* (2013.01); *G11C 11/18* (2013.01); *H01L 27/224* (2013.01)

(58) Field of Classification Search
   CPC . G11C 11/1659; G11C 11/1675; G11C 11/18; G11C 11/1673; H01L 27/224
   USPC .................................................. 365/158, 173
   See application file for complete search history.

(56) References Cited

U.S. PATENT DOCUMENTS

| | | | |
|---|---|---|---|
| 2016/0064650 A1* | 3/2016 | Wang | H01L 27/228 257/427 |
| 2017/0076770 A1* | 3/2017 | Daibou | H01L 27/228 |
| 2017/0169872 A1* | 6/2017 | Yoda | H01L 43/02 |
| 2017/0270985 A1* | 9/2017 | Shimomura | G11C 11/161 |
| 2018/0040358 A1* | 2/2018 | Noguchi | G11C 11/161 |
| 2018/0061467 A1* | 3/2018 | Kan | G11C 11/1675 |
| 2019/0334080 A1* | 10/2019 | Ahmed | G11C 11/1659 |
| 2020/0006627 A1* | 1/2020 | Manipatruni | H01L 43/10 |
| 2020/0075670 A1* | 3/2020 | Lin | G11C 11/161 |
| 2020/0136016 A1* | 4/2020 | Lin | H01L 43/12 |
| 2020/0202914 A1* | 6/2020 | Sakhare | G11C 11/161 |
| 2020/0303625 A1* | 9/2020 | Yoshikawa | G11C 11/161 |
| 2021/0158849 A1* | 5/2021 | Saito | H01L 21/8239 |
| 2021/0202827 A1* | 7/2021 | Song | H01L 43/02 |

* cited by examiner

*Primary Examiner* — Michael T Tran
(74) *Attorney, Agent, or Firm* — JCIPRNET

(57) ABSTRACT

A memory device and a memory circuit is provided. The memory device includes a spin-orbit torque (SOT) layer, a magnetic tunnel junction (MTJ), a read word line, a selector and a write word line. The MTJ stands on the SOT layer. The read word line is electrically connected to the MTJ. The write word line is connected to the SOT layer through the selector. The write word line is electrically connected to the SOT layer when the selector is turned on, and the write word line is electrically isolated from the SOT layer when the selector is in an off state.

20 Claims, 12 Drawing Sheets

MEMORY DEVICE AND MEMORY CIRCUIT

BACKGROUND

Many modern electronic devices contain electronic memory. Electronic memory may be volatile memory or non-volatile memory. Non-volatile memory is able to retain data in absence of power, whereas volatile memory loses data when power is cut off. Magnetoresistive random-access memory (MRAM), which uses electron spin to store data, is one promising candidate for next generation non-volatile electronic memory due to advantages over current electronic memory. Compared to current non-volatile memory, such as flash random-access memory, MRAM is faster and has better endurance. Compared to current volatile memory, such as dynamic random-access memory (DRAM) and static random-access memory (SRAM), MRAM has similar performance and density, but lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
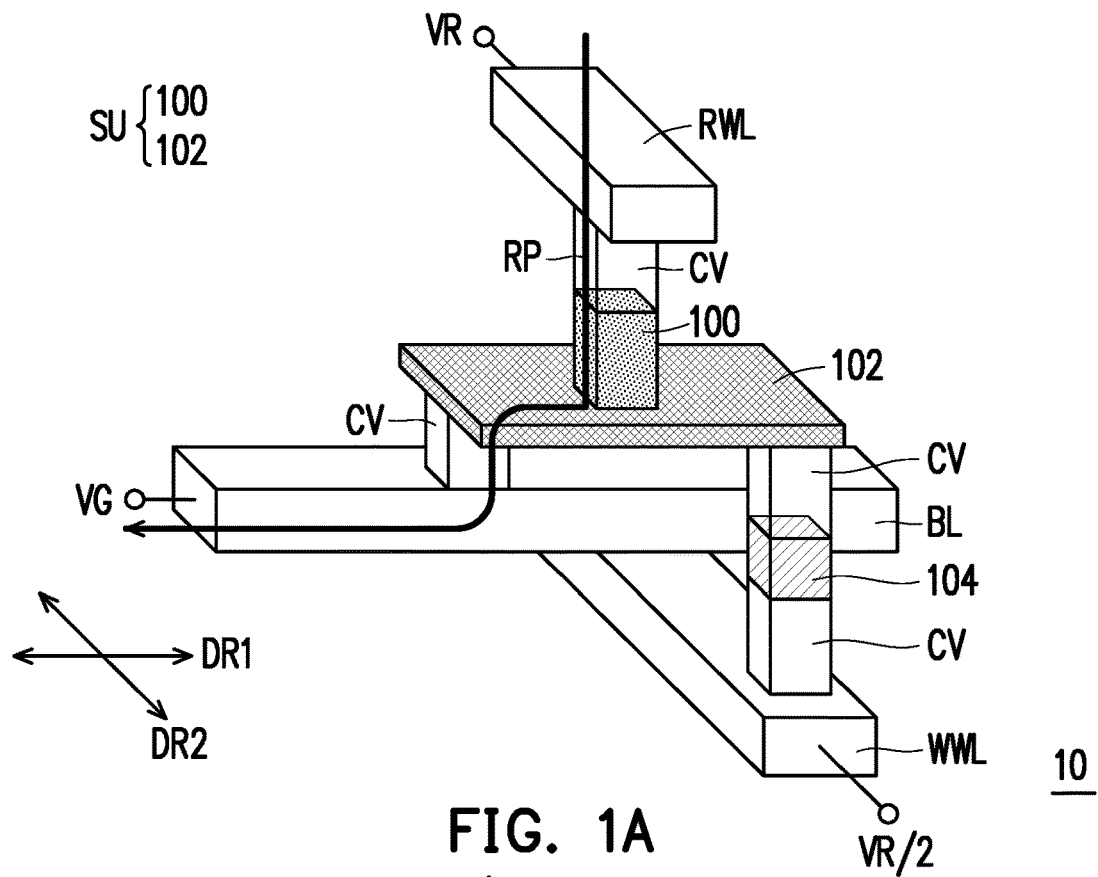
FIG. 1A is a schematic three-dimensional view illustrating a read path of a memory device according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
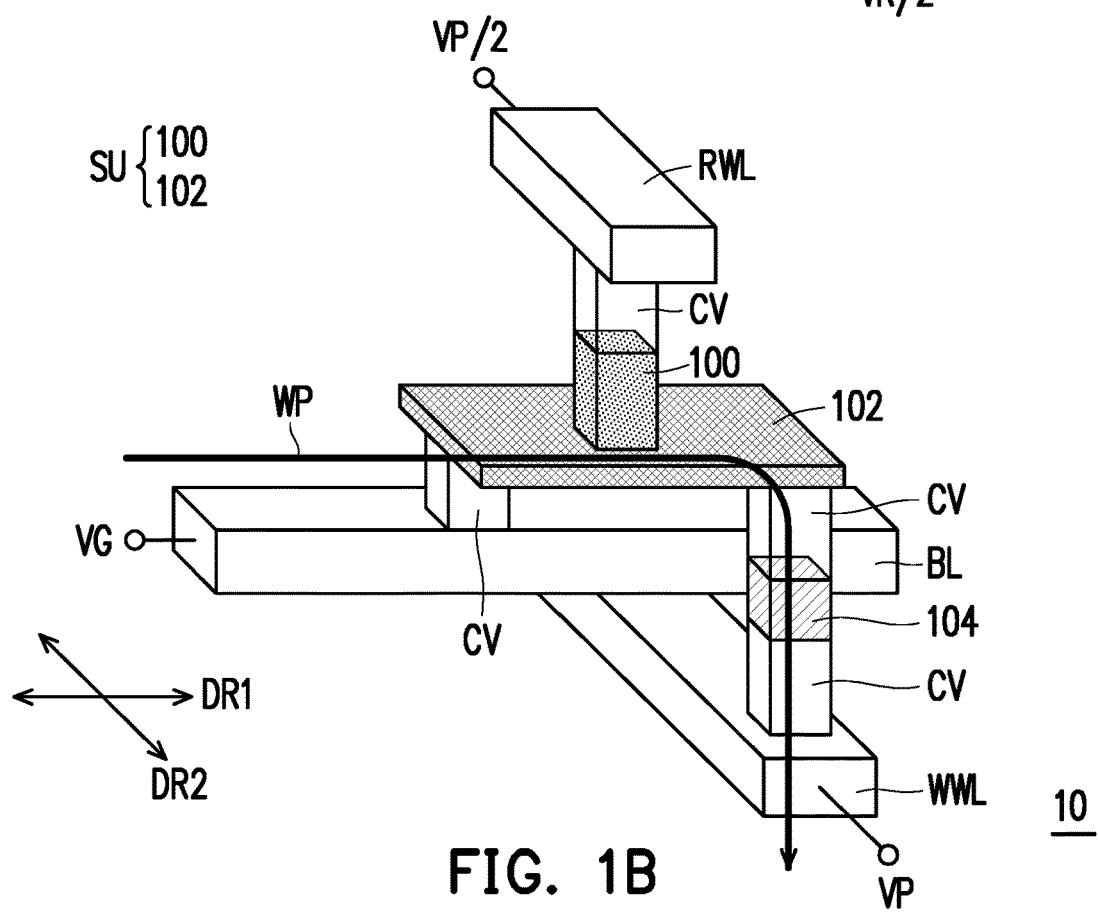
FIG. 1B is a schematic three-dimensional view illustrating a write path of a memory device according to some embodiments of the present disclosure.

FIG. 1A is a schematic three-dimensional view illustrating a read path RP of a memory device 10 according to some embodiments of the present disclosure. FIG. 1B is a schematic three-dimensional view illustrating a write path WP of the memory device 10.

Referring to FIG. 1A and FIG. 1B, the memory device 10 is a magnetoresistive random-access memory (MRAM) device. In some embodiments, the memory device 10 is embedded in an interconnection structure (not shown) formed over logic devices (not shown, such as active devices, passive devices or a combination thereof). At least a portion of the logic devices may be configured to control the memory device 10. The memory device 10 includes a magnetic tunnel junction (MTJ) 100. Although not shown, the MTJ 100 may include an insulating layer (or referred as a tunnel barrier) sandwiched between ferromagnetic layers including a pinned layer and a free layer. Magnetization direction of the free layer can be switched by an external magnetic field, whereas magnetization direction of the pinned layer is fixed. If the magnetizations of the free layer and the pinned layer are in a parallel orientation, it is more likely that electrons will tunnel through the insulating layer than if the magnetizations are in oppositional (antiparallel) orientation. Consequently, the MTJ 100 can be switched between a high resistance state and a low resistance state. In this way, the MTJ 100 can be functioned as a storage unit.

In some embodiments, the memory device 10 is a spin-orbit torque MRAM (SOT-MRAM) device. In these embodiments, a magnetoresistive storage unit SU of the memory device 10 not only includes the MTJ 100, but also includes a spin-orbit torque (SOT) layer 102, which may be made of a heavy metal (e.g., W, Pt, Ta, Ru, Co, Fe, Cu, the like or combinations thereof), a topological insulator (e.g., $Bi_2Se_3$, MgO etc.) or other suitable materials. The SOT layer 102 may be formed as a conductive patch, and the MTJ 100 is standing on the SOT layer 102. During a read operation, read current passes (indicated as the read path RP shown in FIG. 1A) through the MTJ 100. On the other hand, during a write operation, SOT induces switching of the free layer of the MTJ 100 by injecting an in-plane current in the SOT layer 102 (indicated as the write path WP shown in FIG. 1B). As a result of such separate read and write paths RP, WP, the magnetoresistive storage unit SU may have three terminals. In some embodiments, the three terminals are electrically coupled to a read word line RWL, a bit line BL and a write word line WWL, respectively. The read path RP (as shown in FIG. 1A) is established between the read word line RWL and the bit line BL, and the write path WP (as shown in FIG. 1B) is established between the write word line WL and the bit line BL. Regarding configuration of these transmission lines, the read word line RWL is electrically connected to the MTJ 100, whereas the bit line BL and the write word line WWL are electrically connected to the SOT layer 102. A conductive via CV may be disposed between the read word line RWL and the MTJ 100. In addition, a conductive via CV may be disposed between the bit line BL and the SOT layer 102, and at least one conductive via CV may be disposed between the write word line WWL and the SOT layer 102. The conductive via CV electrically connected to the bit line BL may be laterally separated from the conductive via(s) CV electrically connected to the write word line WWL, and the MTJ 100 is standing on a portion of the SOT layer 102 located between theses separated conductive vias CV. For instance, the SOT layer 102 is formed as a rectangular conductive patch, and these separated conductive visas CV may be connected to diagonal corners of the SOT layer 102, respectively. In some embodiments, the MTJ 100 and the read word line RWL are located at a top side of the SOT layer 102, whereas the bit line BL and the write word line WWL may be located at a bottom side of the SOT layer 102. In addition, the bit line BL may extend along a direction intersected with a direction along which the read word line RWL and the write word line WWL extend. For instance, the bit line BL may extend along a first direction DR1, whereas the read word line RWL and the write word line WWL may extend along a second direction DR2 substantially perpendicular to the first direction DR1.

In some embodiments, the memory device 10 further includes a selector 104. The selector 104 is connected between the SOT layer 102 and the write word line WWL, and may be functioned as a switch on the write path WP (shown in FIG. 1B). The selector 104 may be a two-terminal selector. When a bias voltage across the selector 104 (i.e., a voltage difference between the bit line BL and the write word line WWL) is greater than a turn-on voltage of the selector 104, the selector 104 becomes conductive, and the write path WP (shown in FIG. 1B) can be established. In contrast, when the bias voltage across the selector 104 does not reach to the turn-on voltage of the selector 104, the selector 104 is insulative, and the write path WP (shown in FIG. 1B) is cut off. As such, the write word line WWL can be selectively in electrical contact with the SOT layer 102. As compared to a memory device of which a SOT layer is in direct electrical connection to a write word line without a selector in between, the MTJ 100 in the memory device 10 having the selector 104 connected between the SOT layer 102 and the write word line WWL can be avoided from being accidentally programmed when the memory device 10 is not selected by keeping the selector 104 in an off state. In other words, write disturbance of a memory array including a plurality of the memory devices 10 can be reduced. Furthermore, the selector 104 can further prevent the MTJ 100 from being accidentally programmed during a read operation. In some embodiments, a terminal (e.g., a top terminal) of the selector 104 is connected to the SOT layer 102 through one of the conductive vias CV, and another terminal (e.g., a bottom terminal) of the selector 104 is connected to the write word line WWL through another one of the conductive vias CV. In those embodiments where the bit line BL and the write word line WWL are disposed below the SOT layer 102, bottom ends of the selector 104 and the bit line BL may be at the same height, and the bit line BL and the selector 104 may or may not have the same thickness.

On the other hand, the memory device 10 may not have a selector on the read path RP (shown in FIG. 1A). That is, a selector may be absent between the MTJ 100 and the read word line RWL. If a selector is disposed on the read path RP (e.g., between the MTJ 100 and the read word line RWL), a read margin (i.e., a difference between currents flowing through MTJ in different resistance states and collected by the bit line) of the memory device 10 may be compromised as a result of a considerable on-resistance of this selector.

In some embodiments, a method for forming the MTJ 100 and the overlying conductive via CV may include simultaneously patterning material layers (not shown) for forming the MTJ 100 and a conductive layer (not shown) for forming the conductive via CV, and a lithography process and one or more etching processes may be performed during this patterning step. In these embodiments, sidewalls of the MTJ 100 and the overlying conductive via CV may be substantially coplanar with each other. In addition, the MTJ 100 and the overlying conductive via CV may be collectively regarded as a structure standing on the SOT layer 102, and this structure may or may not be tapered toward the SOT layer 102. Similarly, a method for forming the selector 104 and the overlying and underlying conductive vias CV may include simultaneously patterning material layers (not shown) for forming the selector 104 and conductive layers (not shown) for forming the conductive vias CV, and a lithography process and one or more etching processes may be performed during this patterning step. In this way, sidewalls of the selector 104 and the overlying and underlying conductive vias CV may be coplanar with one another. In addition, the selector 104 and the overlying and underlying conductive vias CV may be collectively regarded as a structure connecting to the write word line WWL, and this structure may or may not be tapered downwardly. In alternative embodiments, the material layers for forming the MTJ 100 and the conductive layer for forming the conductive via CV over the MTJ 100 may be patterned separately. In these alternative embodiments, a sidewall of the MTJ 100 may or may not be coplanar with a sidewall of the overlying conductive via CV. Similarly, the material layers for forming the selector 104 and the conductive layers for forming the conductive vias CV lying below and above the selector 104 may be patterned separately, and sidewalls of the selector 104 and the underlying and overlying conductive vias CV may or may not be coplanar with one another.

As shown in FIG. 1A, when the memory device 10 is selected during a read operation, the read word line RWL and the bit line BL are configured to receive a read voltage VR and a reference voltage VG (e.g. a ground voltage), respectively. In this way, a bias voltage across the MTJ 100 (i.e., a difference between the read voltage VR and the reference voltage VG) results in current passing through the MTJ 100 along the read path RP. This current may be detected by a sense amplifier (not shown), and a resistance state of the MTJ 100 can be detected. In other words, data stored in the MTJ 100 can be read. In some embodiments, when the memory device 10 is selected during a read operation, the write word line WWL is configured to receive a voltage that can ensure that a voltage difference between the bit line BL and the write word line WWL will not switch on the selector 104. In this way, the write path WP as shown in FIG. 1B would not be formed during a read operation, and the MTJ 100 can be avoided from being accidentally programmed during a read operation. For instance, the voltage of the write word line WWL during a read operation may be substantially equal to or less than half of the read voltage VR (i.e., VR/2), and greater than or substantially equal to the reference voltage VG. As an example shown in FIG. 1A, the voltage of the write word line WWL during a read operation is half of the read voltage VR (i.e., VR/2).

As shown in FIG. 1B, when the memory device 10 is selected during a write operation, the write word line WWL and the bit line BL are configured to receive a write voltage VP and the reference voltage VG, respectively. The write voltage VP is large enough that a voltage difference between the write voltage VP and the reference voltage VG is greater than a turn-on voltage of the selector 104. In this way, the selector 104 can be switched on, and current path can be established between the write word line WWL and the bit line BL (i.e., the write path WP). Once the write path WP is established, an in-plane current passes through the SOT layer 102, and consequently formed SOT induces switching of the free layer (not shown) in the MTJ 100. As such, the MTJ 100 can be programmed. In some embodiments, when the memory device 10 is selected during a write operation, the read word line RWL is configured to receive a voltage that can ensure that current will not pass from the SOT layer 102 to the read word line RWL through the MTJ 100. Therefore, formation of sneak current (i.e., current from the SOT layer 102 to the read word line RWL) during a write operation can be suppressed. In these embodiments, the voltage of the read word line RWL during a write operation is substantially equal to or greater than a voltage level of the SOT layer 102. As an example shown in FIG. 1B, the voltage level at the SOT layer 102 and the voltage received by the read word line RWL during a write operation may both be substantially equal to half of the write voltage VP (i.e., VP/2).

Figure 2A:
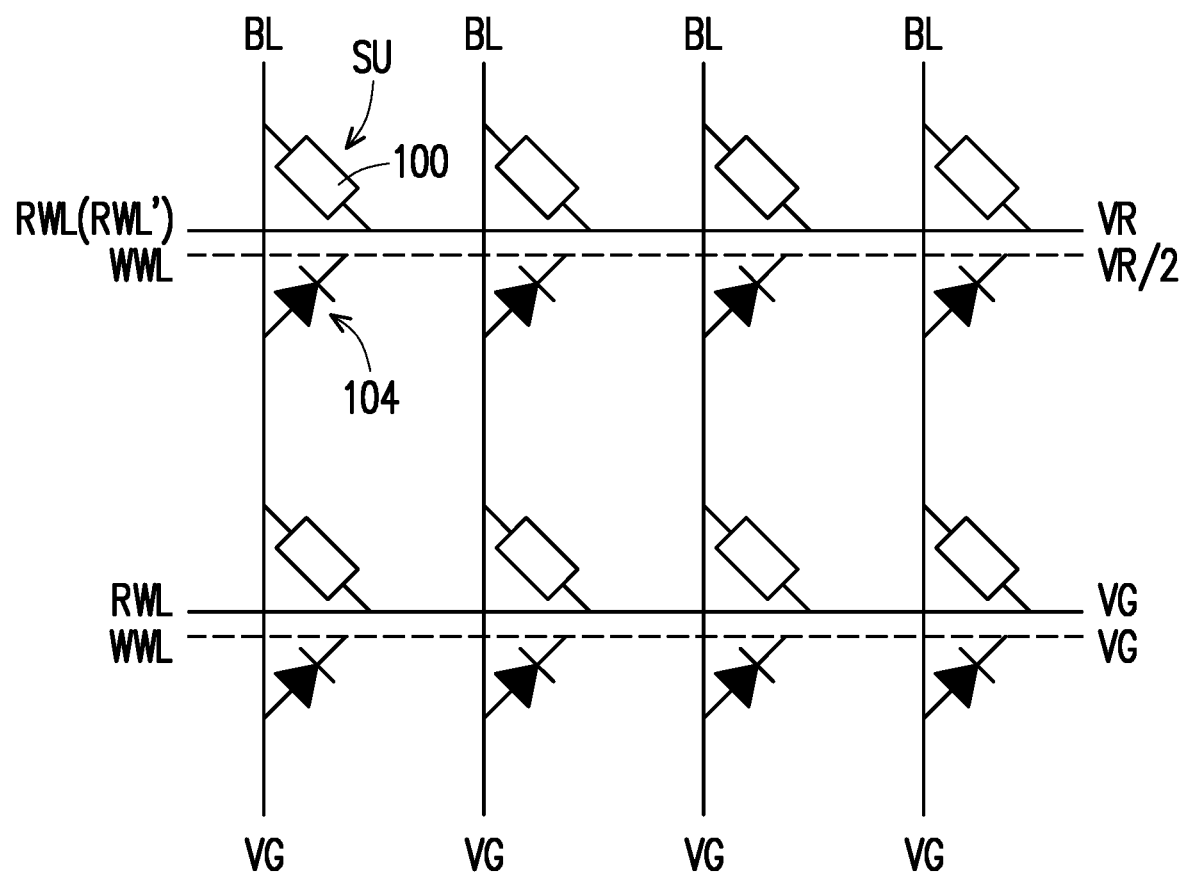
FIG. 2A is a circuit diagram illustrating a memory circuit during a read operation according to some embodiments of the present disclosure.
Figure 2B:
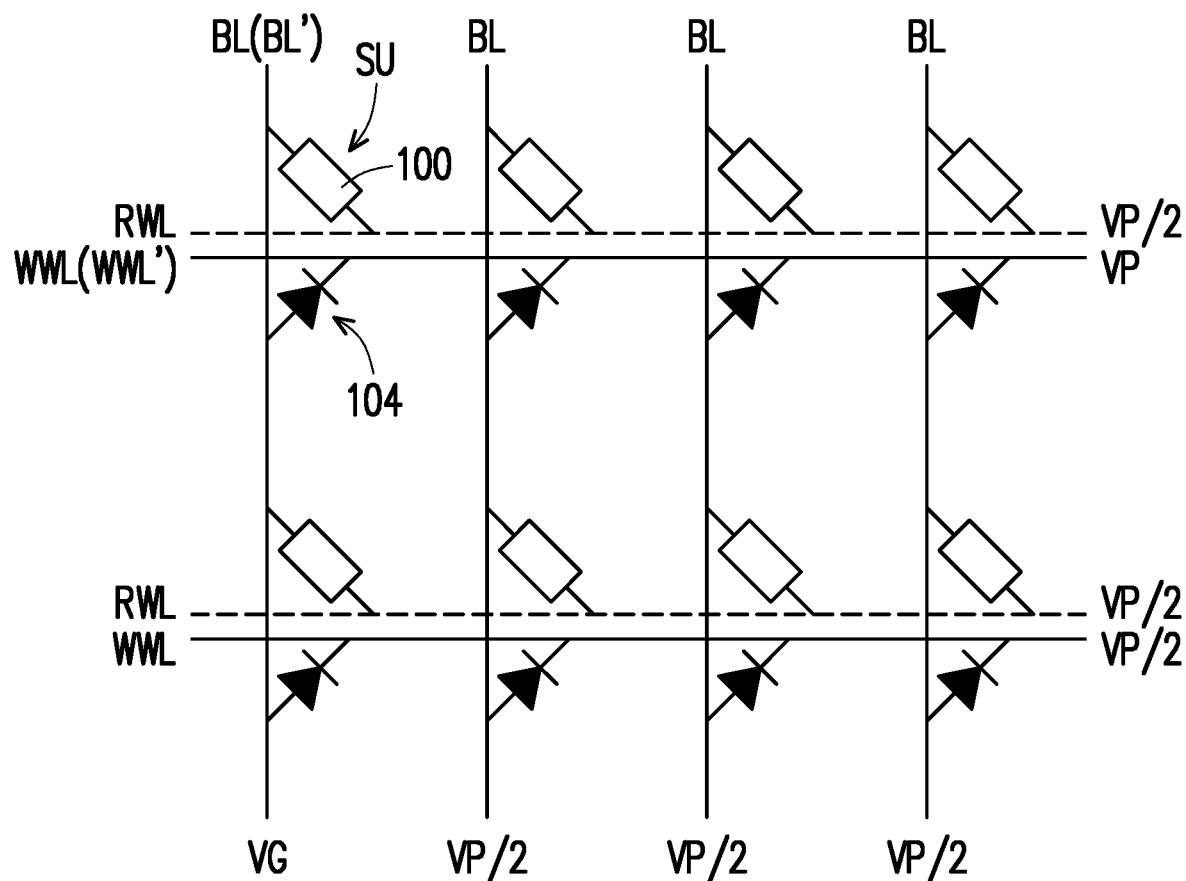
FIG. 2B is a circuit diagram illustrating a memory circuit during a write operation according to some embodiments of the present disclosure.

FIG. 2A is a circuit diagram illustrating a memory circuit 20 during a read operation according to some embodiments of the present disclosure. FIG. 2B is a circuit diagram illustrating the memory circuit 20 during a write operation.

Referring to FIG. 1A, FIG. 1B and FIG. 2A, the memory circuit 20 includes a plurality of the magnetoresistive storage units SU respectively shown in FIG. 1A or FIG. 1B. It should be noted that, only the MTJs 100 of the magnetoresistive storage units SU are depicted, while the SOT layers 102 of the magnetoresistive storage units SU are omitted. The magnetoresistive storage units SU may be arranged as an array having multiple rows and multiple columns. As described above, each of the magnetoresistive storage units SU is connected to a write word line WWL, a read word line RWL and a bit line BL. The magnetoresistive storage units SU in the same row may share one of the write word lines WWL and one of the read word lines RWL. In addition, the magnetoresistive storage units SU in the same column may share one of the bit lines BL. A first terminal of the MTJ 100 in each magnetoresistive storage unit SU is electrically connected to one of the bit lines BL through the SOT layer 102 (not shown in FIG. 2A), and a second terminal of the MTJ 100 is electrically connected to one of the read word line RWL during a read operation. Meanwhile, the MTJ 100 may be electrically disconnected from a corresponding write word line WWL since the selector 104 in between may be controlled in an off state during a read operation (as described with reference to FIG. 1A), and the write word lines WWL are thus depicted as dash lines in FIG. 2A. In some embodiments, a parallel read operation is applied to the memory circuit 20, and a plurality of the magnetoresistive storage units SU connected to one of the read word lines RWL can be read in each parallel read operation. During the parallel read operation, one of the read word lines RWL being selected (labeled as a read word line RWL') is configured to receive the read voltage VR, and at least some of the bit lines BL are configured to receive the reference voltage VG (e.g., ground voltage). In this way, current may pass through the MTJs 100 connected to the selected read word line RWL' and the bit lines BL receiving the reference voltage VG, and may be detected by a sense amplifier (not shown) for identifying the resistance states of these MTJs 100. On the other hand, as described with reference to FIG. 1A, the write word line WWL connected to the selected row of magnetoresistive storage units SU may receive a voltage that can ensure isolation between this write word line WWL and the selected MTJs 100 by keeping the selectors 104 therebetween in an off state. As shown in an example illustrated in FIG. 2A, this write word line WWL receives a voltage substantially equal to half of the read voltage VR (i.e., VR/2) during the parallel read operation. Moreover, as shown in FIG. 2A, unselected read word lines RWL and remainder of the write word lines WWL may receive the reference voltage VG. Alternatively, the unselected read word lines WL and remainder of the write word lines WWL may be electrically floated.

In alternative embodiments, a direct read operation is applied to the memory circuit 20, and the MTJ 100 (not shown) in one of the memory devices 10 can be read in each direct read operation. During the direct read operation, one of the read word lines RWL being selected (labeled as a write word line RWL') is configured to receive the read voltage VR, and one of the bit lines BL being selected is configured to receive the reference voltage VG (e.g., ground voltage). In this way, current may pass through the MTJ 100 connected to the selected read word line RWL' and the selected bit line BL, and may be detected by a sense amplifier (not shown) for identifying the resistance state of this MTJ 100. On the other hand, as described with reference to FIG. 1A, the write word line WWL connected to the selected magnetoresistive storage unit SU may receive a voltage that can ensure isolation between this write word line WWL and the selected MTJ 100 by keeping the selector 104 therebetween in an off state. As an example, this write word line WWL receives a voltage substantially equal to half of the read voltage VR (i.e., VR/2) during the direct read operation. Moreover, unselected read word lines RWL, unselected bit lines BL and remainder of the write word lines WWL may receive the same voltage, such that the corresponding selectors 104 can be kept in an off state. As an example, all of the write word lines WWL, the unselected read word lines RWL and the unselected bit lines BL may receive a voltage substantially equal to half of the read voltage VR (i.e., VR/2) during the direct read operation.

Referring to FIG. 1B and FIG. 2B, during a write operation, a terminal of each selected MTJ 100 is connected to one of the bit lines BL, and also connected to one of the write word lines WWL through a corresponding selector 104. It should be noted that, although not shown in FIG. 2B, each selected MTJ 100 is connected to the corresponding bit line BL and selector 104 through the SOT layer 102 (as shown in FIG. 1B). On the other hand, as described with reference to FIG. 1B, another terminal of each MTJ 100 may be electrically disconnected from a corresponding read word line RWL during a write operation, and the read word lines RWL are accordingly depicted as dash lines in FIG. 2B. In some embodiments, a direct write operation is applied to the memory circuit 20, and one of the magnetoresistive storage units SU may be programmed in each time. During the direct write operation, one of the write word lines WWL being selected (labeled as a write word line WWL') is configured to receive the write voltage VP, and one of the bit lines BL being selected (labeled as a bit line BL') is configured to receive the reference voltage VG (e.g., ground voltage). In this way, the selector 104 connected between the selected write word line WWL' and the selected bit line BL' can be switched on, such that an in-plane current passes through the corresponding SOT layer 102 (not shown), and the MTJ 100 standing thereon can be programmed. On the other hand, as described with reference to FIG. 1B, the read word line RWL connected to the selected magnetoresistive storage unit SU may receive a voltage (e.g., half of the write voltage VP/2) that can prevent current from passing to this read word lines RWL, so as to avoid from formation of sneak current. Moreover, a voltage difference between unselected write word lines WWL and unselected bit lines BL during the direct write operation may be small enough to avoid from turning on the corresponding selectors 104, such that the corresponding MTJs 100 can be prevented from being accidentally programmed. In other words, write disturbance of the memory circuit 20 can be reduced. In some embodiments, the unselected write word lines WWL and the unselected bit lines BL are configured to receive the same voltage (e.g., half of the write voltage VP/2) during the direct write operation. In addition, the read word lines RWL connected to the unselected magnetoresistive storage units SU may receive a voltage identical to the voltage of the unselected write word lines WWL and the unselected bit lines BL (e.g., half of the write voltage VP/2).

In alternative embodiments, a parallel write operation may be applied to the memory circuit 20, and multiple magnetoresistive storage units SU may be programmed in each time. In these embodiments, at least some of the write word lines WWL are selected and configured to receive the write voltage VP, and at least some of the bit lines BL are selected and configured to receive the reference voltage VG (e.g., ground voltage). On the other hand, as similar to the direct write operation, the read word lines RWL may receive a voltage (e.g., half of the write voltage VP/2) that can prevent current from passing to the read word lines RWL from the SOT layers (not shown) during the parallel write operation, and a voltage difference between unselected write word lines WWL and unselected bit lines BL during the parallel write operation may be small enough to avoid from turning on the selectors 104 connected to the unselected magnetoresistive storage units SU. In certain cases, a data pattern can be programmed into the magnetoresistive storage units SU connected to one of the write word lines WWL by performing two parallel write operations. During a first parallel write operation, all of the magnetoresistive storage units SU connected to the selected write word lines WWL may be programmed with the same logic data (e.g., logic "0"). During a second parallel write operation, some of these magnetoresistive storage units SU may be selected and programmed with another logic data (e.g., logic "1") complementary to the logic data (e.g., logic "0") written in the first parallel write operation. In this way, a data pattern including complementary logic data can be programmed into the magnetoresistive storage units SU connected to the selected write word line WWL. However, those skilled in the art may apply other suitable write operation for programming the magnetoresistive storage units SU according to design requirements, the present disclosure is not limited thereto.

FIG. 3A through FIG. 3D are schematic cross-sectional views illustrating selectors according to some embodiments of the present disclosure.

Figure 3A:
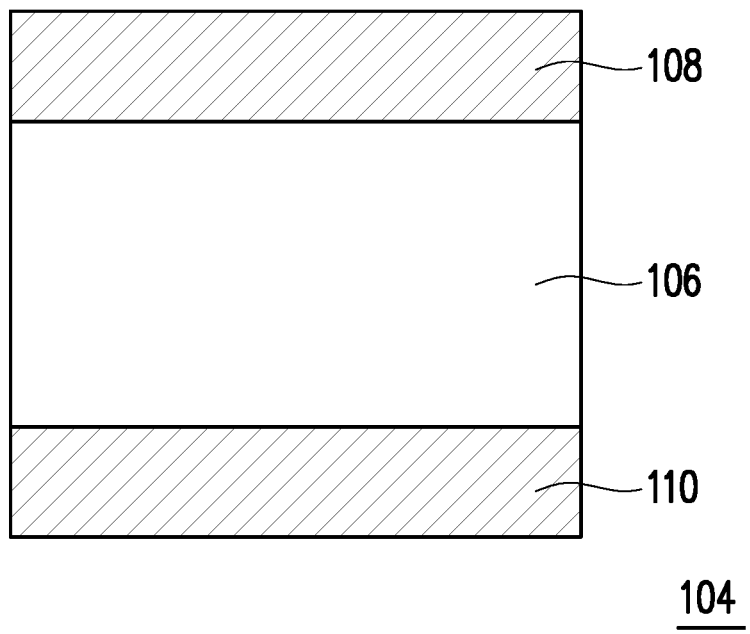
FIG. 3A through FIG. 3D are schematic cross-sectional views illustrating selectors according to some embodiments of the present disclosure.

Referring to FIG. 3A, the selector 104 may be a threshold-type selector. In some embodiments, the threshold-type selector is an ovonic threshold switch (OTS) selector. In these embodiments, the selector 104 includes an OTS layer 106 sandwiched between top and bottom conductive layers 108, 110. The OTS layer 106 exhibits a rapid and reversible transition between a high resistance state (off state) and a low resistance state (on state) in response to a bias voltage applied to the OTS layer 106 almost without retention time, and such bias voltage can be a positive bias voltage or a negative bias voltage. The OTS layer 106 may include a binary material, a ternary material or a quadruple material. For instance, the binary material may include SiTe, GeTe, CTe, BTe, ZnTe, AlTe, GeSe, GeSb, SeSb, SiAs, GeAs, AsTe, BC or the like, and the binary material may or may not be doped with nitrogen or oxygen. The ternary material may include GeSeAs, GeSeSb, GeSbTe, GeSiAs, GeAsSb, SeSbTe, SiTeSe or the like, and the ternary material may or may not be doped with nitrogen, oxygen or carbon. The quadruple material may include GeSeAsTe, GeSeTeSi, GeSeTeAs, GeTeSiAs, GeSeAsSb, GeSeSbSi or the like, and the quadruple material may or may not be doped with nitrogen, oxygen or carbon. In addition, the conductive layers 108, 110 may respectively include TaN, Ta, Ti, TiN, W, Cu, Ru, Al, the like or combinations thereof. However, those skilled in the art may select other suitable materials for forming the OTS layer 106 and the conductive layers 108, 110 according to design requirements, the present disclosure is not limited thereto.

Figure 3B:
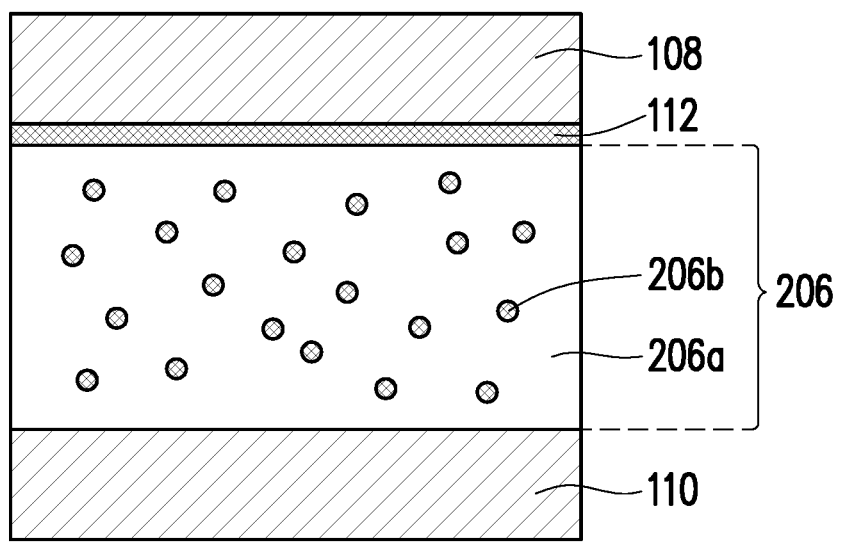

Referring to FIG. 3B, in some embodiments, the threshold-type selector is a conductive bridge (CB) selector, which may also be referred as a voltage conductive bridge (VCB) selector. In these embodiments, the OTS layer 106 as shown in FIG. 3A is replaced by a switching layer 206. The switching layer 206 may include a solid electrolyte 206a and ions 206b spreading in the solid electrolyte 206a. For instance, the solid electrolyte 206a may include hafnium oxide, and the ions 206b may include Ag ions, Cu ions, Al ions, As ions, Te ions, the like or combinations thereof. When a voltage difference of the conductive layers 108, 110 exceeds a threshold voltage of the selector 104, the ions 206b are localized, and a conductive path (or referred as a conductive filament) is formed in the solid electrolyte 206a and connecting between the conductive layers 108, 110 almost without retention time. As such, the selector 104 is switched on. On the other hand, the ions 206b are delocalized when a proper bias voltage across the selector 104 is absent, and the conductive path is cut off in the solid electrolyte 206a almost without retention time. Accordingly, the selector 104 is in an off state. In some embodiments, the ions 206b may be provided by a reservoir layer 212 disposed between the switching layer 206 and one of the conductive layers 108, 110 (e.g., between the switching layer 206 and the conductive layer 108). For instance, a material of the reservoir layer 212 may include Ag, Cu, Al, As, Te, the like or combinations thereof. In alternative embodiments, the ions 206b may be provided by an implantation process performed on the solid electrolyte 206a. In these alternative embodiments, the reservoir layer 212 may or may not be omitted.

Figure 3C:
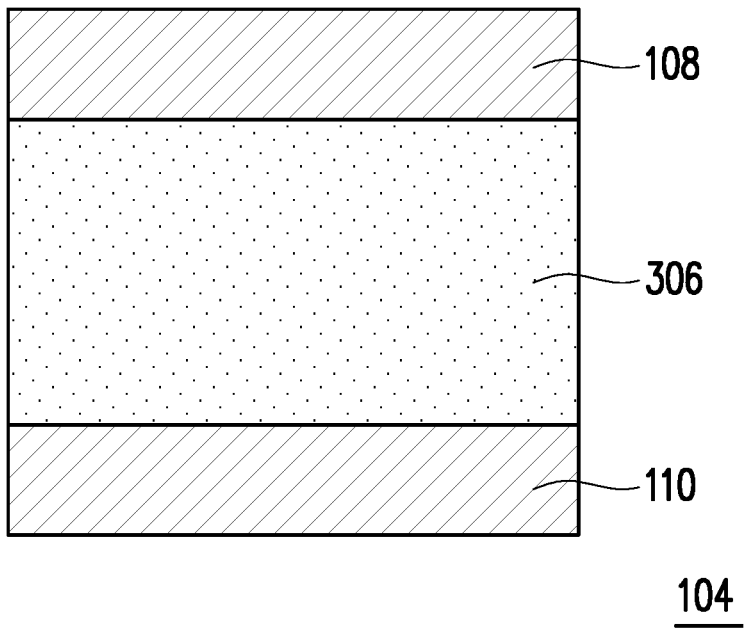

Referring to FIG. 3C, in other embodiments, the selector 104 may be an exponential-type selector. In these embodiments, the OTS layer 106 as shown in FIG. 3A is replaced by a tunneling layer 306. Given a fixed thickness of the tunneling layer 306, carriers may tunnel through the tunneling layer 306 by controlling a bias voltage of the tunneling layer 306. This tunneling behavior can be explained by, for example, direct tunneling effect or Fowler-Nordheim tunneling (FN tunneling) effect. Once the tunneling of carriers is formed between the conductive layers 108, 110, the selector 104 is turned on. Otherwise, the selector 104 is in an off state. In some embodiments, a material of the tunneling layer 306 may include titanium oxide, tantalum oxide, nickel oxide or the like. In certain embodiments, the tunneling layer 306 is a multilayer structure including, for example, a TiN layer and a Si layer.

Figure 3D:
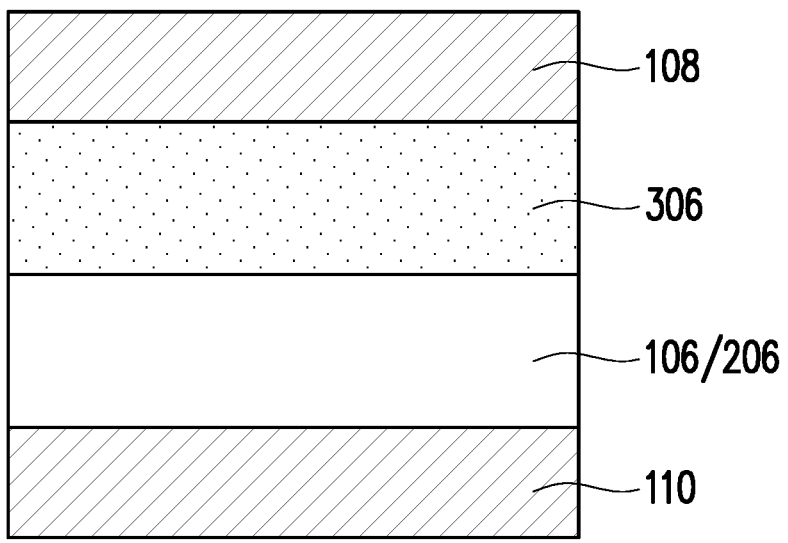

Referring to FIG. 3D, in yet other embodiments, the selector 104 is a mixed-type selector having a threshold characteristic of a threshold-type selector described with reference to FIG. 3A, FIG. 3B and an exponential characteristic of the exponential-type selector as described with reference to FIG. 3C. As shown in FIG. 3D, the selector 104 includes the OTS layer 106 (shown in FIG. 3A) or the switching layer 206 (shown in FIG. 3B) of a threshold-type selector, and further includes the tunneling layer 306 (shown in FIG. 3C) of an exponential-type selector. As shown in FIG. 3D, the OTS layer 106 or the switching layer 206 is closer to the bottom conductive layer 110, whereas the tunneling layer 306 is closer to the top conductive layer 108. However, stacking sequence of the OTS layer 106/switching layer 206 and the tunneling layer 306 can be reversed. In addition, when the selector 104 includes the switching layer 206 and the tunneling layer 306, the selector 104 may or may not further include the reservoir layer 212 (shown in FIG. 3B) between the switching layer 206 and the closest conductive layer (e.g., the bottom conductive layer 110).

Figure 4A:
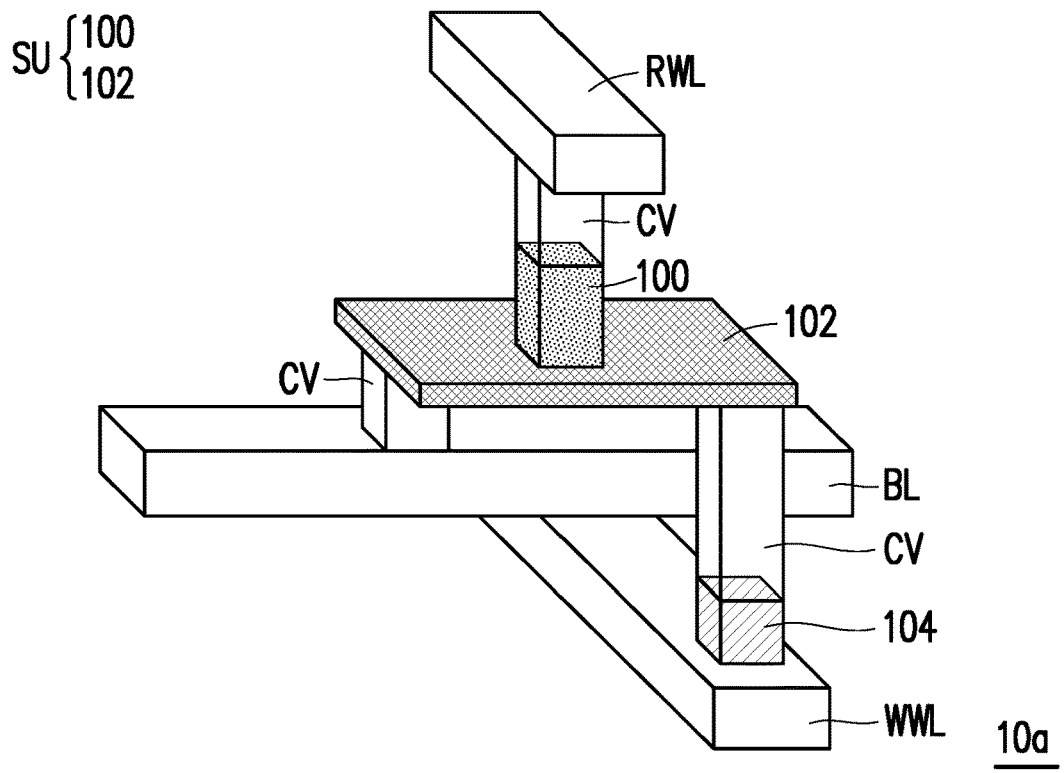
FIG. 4A through FIG. 4C are schematic three-dimensional views illustrating memory devices according to some embodiments of the present disclosure.
Figure 4B:
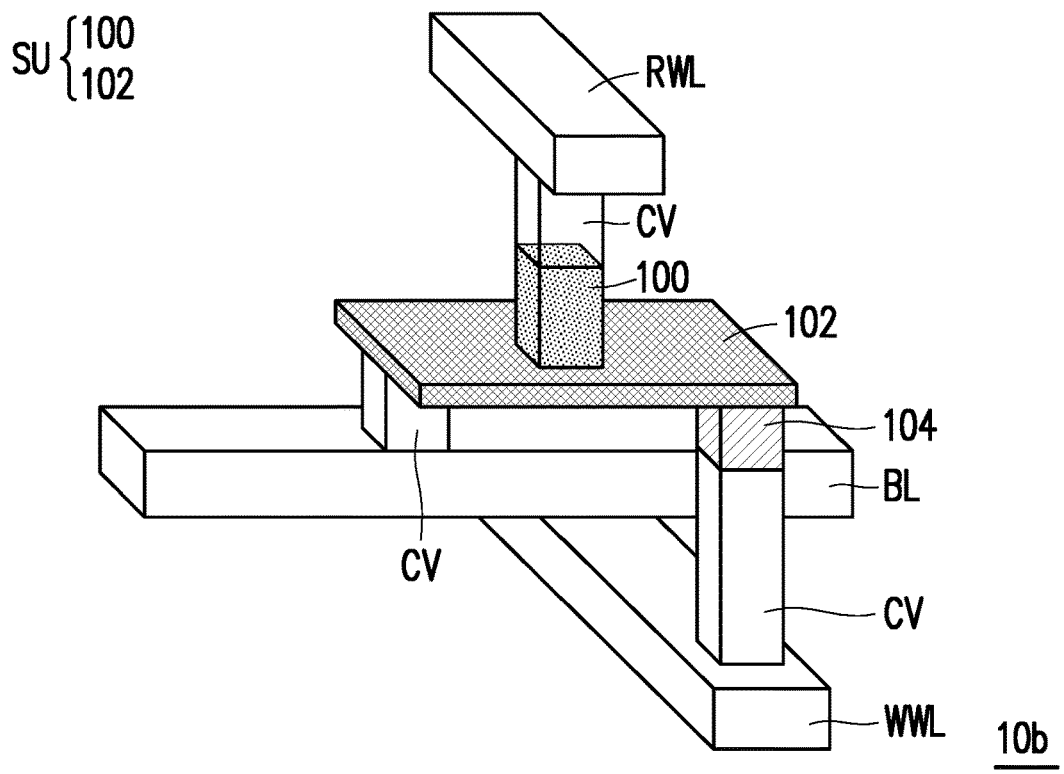
Figure 4C:
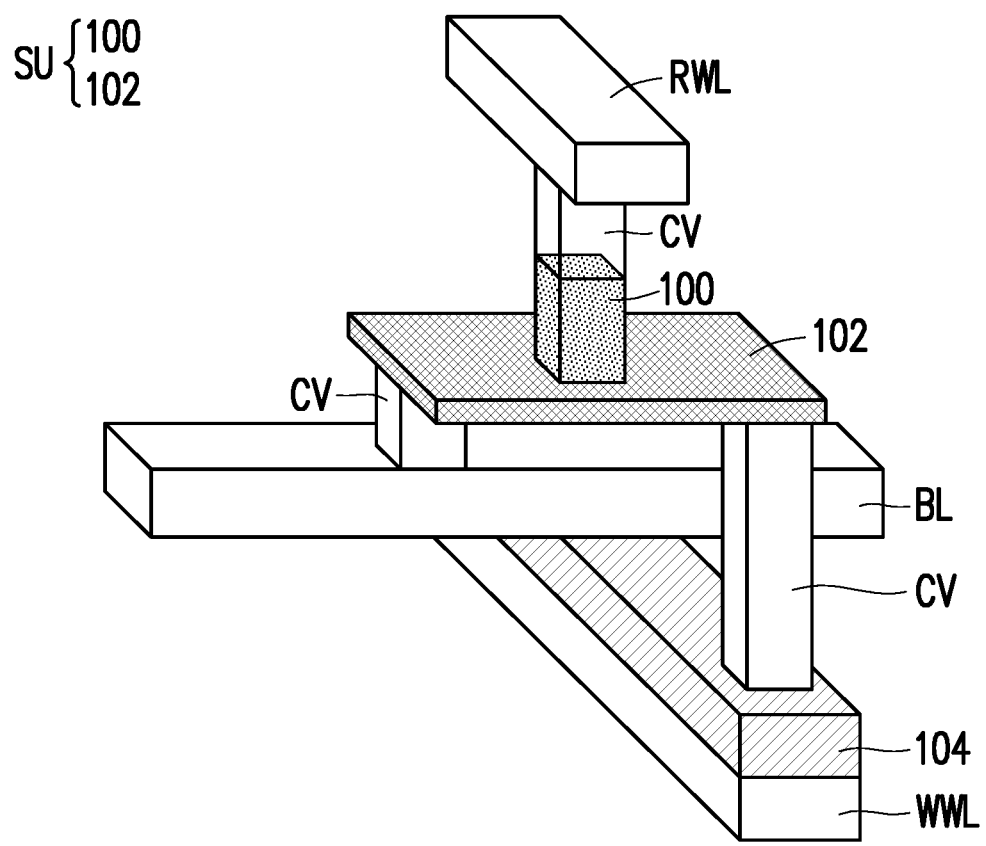

FIG. 4A through FIG. 4C are schematic three-dimensional views illustrating memory devices 10a, 10b and 10c according to some embodiments of the present disclosure. These memory devices 10a, 10b and 10c are similar to the memory device 10 as shown in FIG. 1A or FIG. 1B. Only difference therebetween will be described, the same or the like parts would not be repeated again.

Referring to FIG. 4A, in some embodiments, a conductive via is absent between the selector 104 and the write word line WWL. In those embodiments where the write word line WWL is disposed below the SOT layer 102, the selector 104 is standing on the write word line WWL without a conductive via in between, while connecting to the overlying SOT layer 102 through one of the conductive vias CV. Regarding manufacturing of the selector 104 and the overlying conductive via CV, material layers for forming the selector 104 and a conductive layer for forming the conductive via CV may be patterned simultaneously, and a lithography process and one or more etching processes may be performed during this patterning step. Alternatively, the selector 104 and the overlying conductive via CV may be formed by separate patterning steps. Those skilled in the art may adjust a vertical length of the conductive via CV connecting between the selector 104 and the SOT layer 102, in order to comply with the configuration shown in FIG. 4A.

Referring to FIG. 4B, in some embodiments, a conductive via is absent between the selector 104 and the SOT layer 102. In those embodiments where the write word line WWL is disposed below the SOT layer 102, the selector 104 is connected to the overlying SOT layer 102 without a conductive via in between, while connecting to the underlying write word line WWL through one of the conductive vias CV. As similar to the manufacturing method described with reference to FIG. 4A, material layers for forming the selector 104 and a conductive layer for forming the underlying conductive via CV shown in FIG. 4B may be patterned simultaneously or separately. In addition, those skilled in the art may adjust a vertical length of the conductive via CV connecting between the selector 104 and the write word line WWL, in order to comply with the configuration shown in FIG. 4B.

In those embodiments described with reference to FIG. 4A and FIG. 4B, each of the conductive vias CV connected to opposite terminals of the selector 104 can be optionally omitted. Therefore, for the selector 104 with various vertical heights, a vertical distance between the SOT layer 102 and the write word line WWL can be more flexibly adjusted.

Referring to FIG. 4C, in some embodiments, the selector 104 is formed in a line shape, and a conductive via may be absent between the selector 104 and the write word line WWL. In addition, the line-shaped selector 104 is connected to the SOT layer 102 through one of the conductive vias CV. In those embodiments where the write word line WWL is disposed below the SOT layer 102, the line-shaped selector 104 is extending on the write word line WWL, and the line-shaped selector 104 and the write word line WWL may extend along the same direction. The conductive via CV standing on the line-shaped selector 104 is connected between the line-shaped selector 104 and the SOT layer 102. In some embodiments, a conductive layer (not shown) for forming the write word line WWL and material layers (not shown) for forming the line-shaped selector 104 may be patterned simultaneously, and a lithography process and one or more etching processes may be performed during this patterning step. In addition, the conductive via CV may be formed after formation of the write word line WWL and the line-shaped selector 104, and those skilled in the art may adjust a vertical length of the conductive via CV connecting between the selector 104 and the SOT layer 102, in order to comply with the configuration shown in FIG. 4C.

In those embodiments described with reference to FIG. 4C, the selector 104 may have a larger volume, and may be less affected by possible etching damage during formation of the selector 104. In addition, as compared to pillar type selector 104 (as shown in FIG. 1A, FIG. 1B, FIG. 4A and FIG. 4B), the line shape selector 104 as shown in FIG. 4C may have a larger coupling area, which may result in smaller on-resistance of the selector 104. Accordingly, current provided to the SOT layer 102 for programming the MTJ 100 can be reduced, thus the driving transistor (not shown) can be further scaled.

FIG. 5A through FIG. 5E are schematic three-dimensional views illustrating memory devices 10d-10h according to some embodiments of the present disclosure. These memory devices 10d-10h are similar to the memory device 10 as shown in FIG. 1A or FIG. 1B. Only difference therebetween will be described, the same or the like parts would not be repeated again.

Figure 5A:
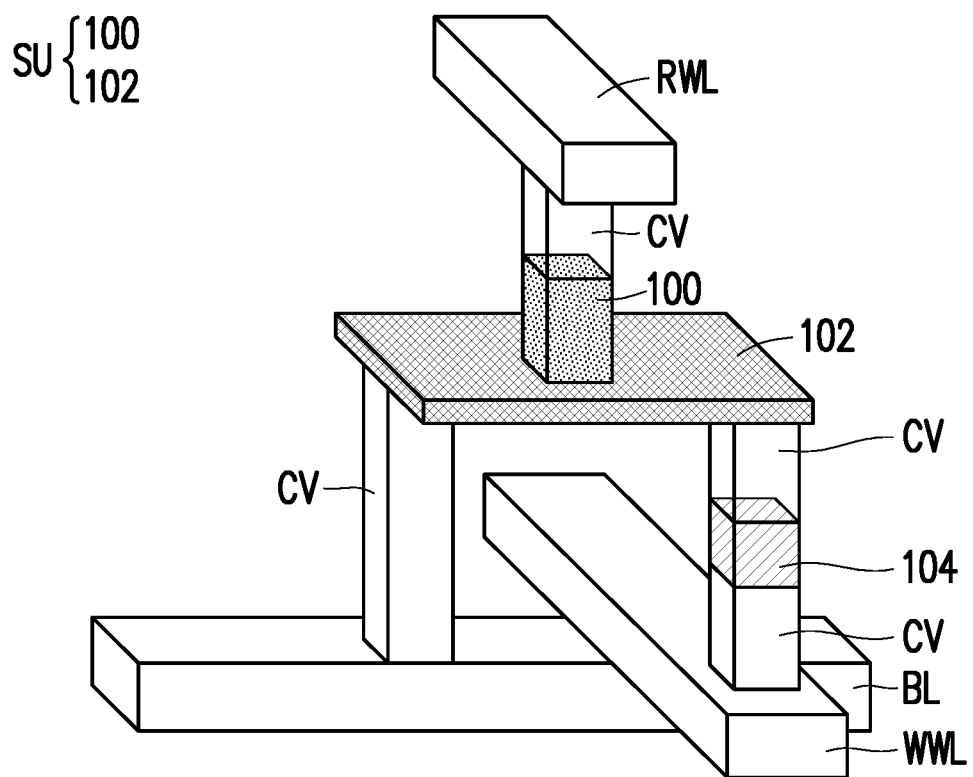
FIG. 5A through FIG. 5E are schematic three-dimensional views illustrating memory devices according to some embodiments of the present disclosure.

Referring to FIG. 1A and FIG. 5A, difference between the memory device 10 shown in FIG. 1A and the memory device 10d shown in FIG. 5A lies in configurations of the bit line BL and the write word line WWL. As shown in FIG. 1A, the write word line WWL is extending below the bit line BL. On the other hand, as shown in FIG. 5A, the write word line WWL is extending above the bit line BL. In this way, the selector 104 connecting between the write word line WWL and the SOT layer 102 is located above the bit line BL as well. In addition, vertical lengths of the conductive vias CV connecting to the bit line BL, the write word line WWL and the selector 104 may be adjusted to comply with such configuration. Moreover, at least one of the conductive vias CV lying above and below the selector 104 may be omitted as described with reference to FIG. 4A and FIG. 4B, and the selector 104 may be formed in a line shape as described with reference to FIG. 4C.

Figure 5B:
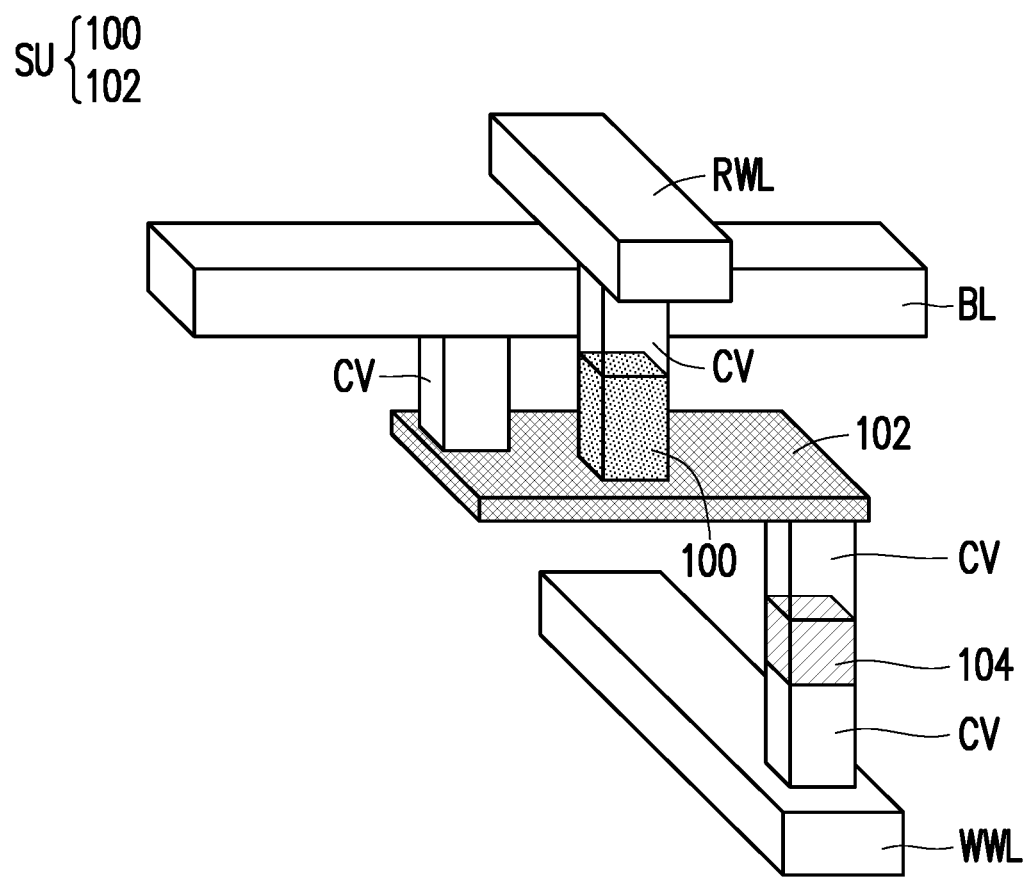

Referring to FIG. 1A and FIG. 5B, difference between the memory device 10 shown in FIG. 1A and the memory device 10e shown in FIG. 5B lies in locations of the bit line BL and the conductive via CV connected to the bit line BL. As shown in FIG. 1A, the bit line BL is connected to the SOT layer 102 from below the SOT layer 102, along with the selector 104 and the write word line WWL. On the other hand, as shown in FIG. 5B, the bit line BL is connected to the SOT layer 102 from above the SOT layer 102, along with the MTJ 100 and the read write line RWL. Accordingly, the conductive via CV connecting between the bit line BL and the SOT layer 102 is above the SOT layer 102. In some embodiments, the bit line BL is extending below the read word line RWL. Those skilled in the art may adjust vertical lengths of the conductive vias CV connecting to the bit line BL and the read word line RWL, in order to comply with the configuration of the bit line BL and the read word line RWL as shown in FIG. 5B. Moreover, at least one of the conductive vias CV lying above and below the selector 104 may be omitted as described with reference to FIG. 4A and FIG. 4B, and the selector 104 may be formed in a line shape as described with reference to FIG. 4C.

Figure 5C:
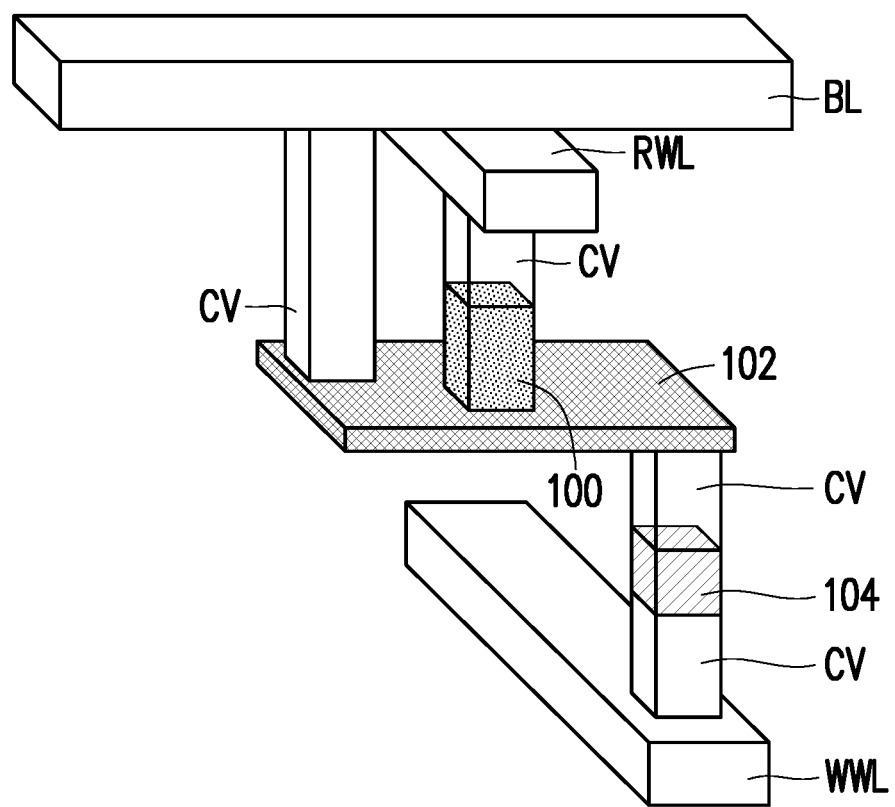

Referring to FIG. 5B and FIG. 5C, difference between the memory device 10e shown in FIG. 5B and the memory device 10f shown in FIG. 5C lies in the configurations of the bit line BL and the read word line RWL. As shown in FIG. 5B, the bit line BL extends below the read word line RWL. On the other hand, as shown in FIG. 5C, the bit line BL extends above the read word line RWL. In the embodiments shown in FIG. 5C, a vertical length of the conductive via CV connected to the bit line BL is greater than a total vertical length of the MTJ 100, the read word line RWL and the conductive via CV in between.

Figure 5D:
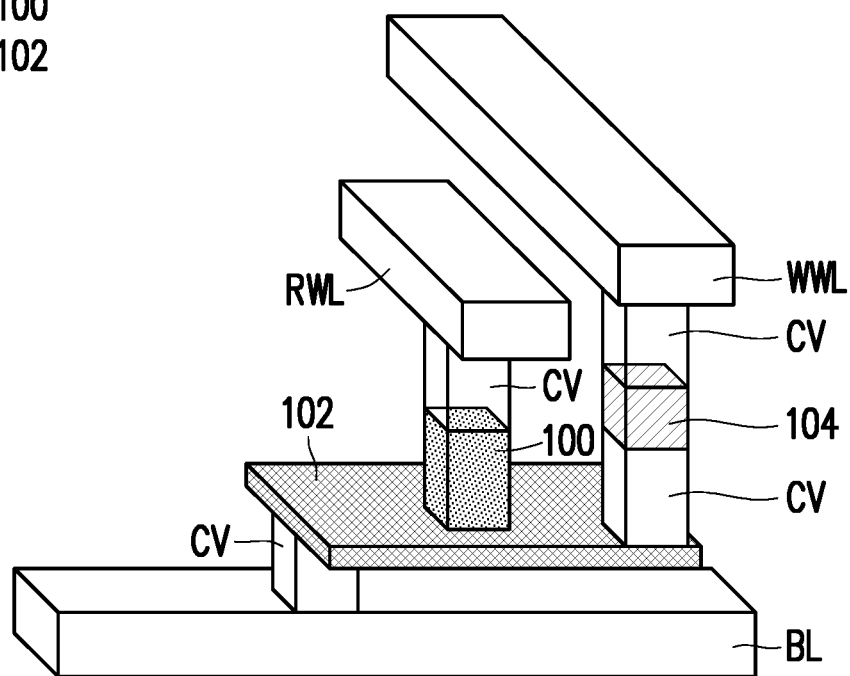

Referring to FIG. 1A and FIG. 5D, difference between the memory device 10 shown in FIG. 1A and the memory device 10g shown in FIG. 5D lies in the locations of the selector 104, the write word line WWL and the conductive via(s) CV connected thereto. As described with reference to FIG. 1A, the selector 104, the write word line WWL are connected to the SOT layer 102 from below the SOT layer 102 through some of the conductive vias CV. As shown in FIG. 5D, the selector 104 and the write word line WWL are connected to the SOT layer 102 from above the SOT layer 102. Accordingly, the conductive vias CV connected to the selector 104 and the write word line WWL are located above the SOT layer 102 as well. The conductive via CV connected to the selector 104 is laterally separated from the conductive via CV connected to the bit line BL, such that the MTJ 100 can be connected to a portion of the SOT layer 102 between the conductive via CV connected to the bit line BL and the conductive via CV connected to the selector 104. For instance, the SOT layer 102 may be formed as a rectangular conductive patch, and the conductive via connected to the bit line BL and the conductive via CV connected to the selector 104 may be located at diagonal corners of this rectangular conductive patch. In some embodiments, the write word line WWL extends above the read word line RWL. Those skilled in the art may adjust the conductive vias CV connected to the read word line RWL, the write word line WWL and the selector 104, in order to comply with the configuration of the read word line RWL and the write word line WWL as shown in FIG. 5D. Moreover, at least one of the conductive vias CV lying above and below the selector 104 may be omitted as described with reference to FIG. 4A and FIG. 4B, and the selector 104 may be formed in a line shape as described with reference to FIG. 4C. In those embodiments where the selector 104 is formed in a line shape and located above the SOT layer 102, the line-shaped selector 104 may extend below the write word line WWL, and the write word line WWL and the line-shaped selector 104 may extend along the same direction. In these embodiments, a conductive layer for forming the write word line WWL and material layers for forming the line-shaped selector 104 may simultaneously patterned, and a lithography process and one or more etching processes may be performed during this patterning step.

Alternately, separate patterning processes may be performed for forming the write word line WWL and the line-shaped selector 104.

Figure 5E:
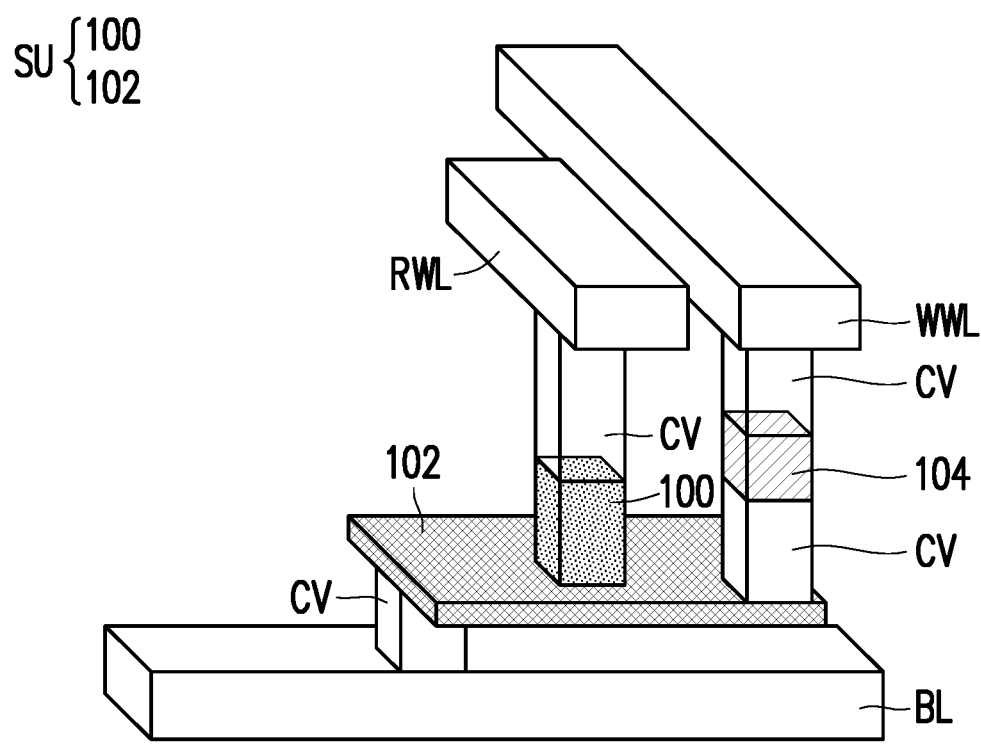

Referring to FIG. 5D and FIG. 5E, difference between the memory device 10g shown in FIG. 5D and the memory device 10h shown in FIG. 5E lies in the configurations of the read word line RWL and the write word line WWL. As shown in FIG. 5D, the write word line WWL extends above the read word line RWL. On the other hand, as shown in FIG. 5E, the write word line WWL and the read word line RWL extend at the same height. Those skilled in the art may adjust vertical lengths of the conductive vias CV connected to the read word line RWL, the write word line WWL and the selector 104, in order to comply with the configuration of the read word line RWL and the write word line WWL.

In those embodiments described with reference to FIG. 5A through FIG. 5E, the storage unit SU can be more flexibly routed. Moreover, in embodiments described with reference to FIG. 5E, the read word line RWL and the write word line WWL extend at the same level, such that a total vertical height of the memory device 10h can be reduced.

As above, a memory device including a magnetoresistive storage unit as well as a memory circuit including a plurality of the magnetoresistive storage units are provided. The magnetoresistive storage unit can be programmed by using spin-orbit torque (SOT), and has three terminals connecting to a read word line, a write word line and a bit line, respectively. The magnetoresistive storage unit is connected to the write word line through a selector, such that a SOT layer of the magnetoresistive storage unit can be selectively in electrical contact with the write word line. That is, the SOT layer is electrically connected to the write word line when the selector is turned on, and is electrically disconnected from the write word line when the selector is in an off state. In this way, a MTJ of the magnetoresistive storage unit can be avoided from being accidentally programmed by keeping the selector in an off state when the magnetoresistive storage unit is not selected during a write operation. Therefore, write disturbance of the memory circuit can be reduced. Similarly, accidentally programming the MTJ during a read operation can be avoided by controlling a bias voltage across the selector. On the other hand, the magnetoresistive storage unit may be connected to the read word line without a selector in between. Therefore, a read margin of the magnetoresistive storage unit may not be compromised as a result of an on-resistance of this selector.

In an aspect of the present disclosure, a memory device is provided. The memory device comprises: a spin-orbit torque (SOT) layer; a magnetic tunnel junction (MTJ), standing on the SOT layer; a read word line, electrically connected to the MTJ; a selector; and a write word line, connected to the SOT layer through the selector, wherein the write word line is electrically connected to the SOT layer when the selector is turned on, and the write word line is electrically isolated from the SOT layer when the selector is in an off state.

In another aspect of the present disclosure, a memory device is provided. The memory device comprises: a SOT layer; a MTJ, standing on the SOT layer; a first word line, electrically connected to the MTJ; a second word line, selectively in electrical contact with the SOT layer; and a bit line, electrically connected to the SOT layer, wherein a portion of the SOT layer on which the MTJ stands is located between a portion of the SOT layer to which the bit line is connected and a portion of the SOT layer to which the second word line is selectively in electrical contact.

In yet another aspect of the present disclosure, a memory circuit is provided. The memory circuit comprises: magnetoresistive storage units, arranged as an array, and respectively configured to be written by spin-orbit torque; read word lines, respectively in direct electrical connection with a row of the magnetoresistive storage units; write word lines, respectively connecting to a row of the magnetoresistive storage units through selectors; and bit lines, respectively connecting to a column of the magnetoresistive storage units.

It should be appreciated that the following embodiment(s) of the present disclosure provides applicable concepts that can be embodied in a wide variety of specific contexts. The embodiments are intended to provide further explanations but are not used to limit the scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a spin-orbit torque (SOT) layer;
   a magnetic tunnel junction (MTJ), standing on the SOT layer;
   a read word line, electrically connected to the MTJ;
   a selector; and
   a write word line, connected to the SOT layer through the selector, wherein the write word line is electrically connected to the SOT layer when the selector is turned on, and the write word line is electrically isolated from the SOT layer when the selector is in an off state,
   wherein the selector is a two-terminal selector, with one terminal connected to the SOT layer and the other terminal connected to the write word line.

2. The memory device according to claim 1, wherein the read word line is connected to the MTJ by a conductive via in physical contact with the read word line and the MTJ.

3. The memory device according to claim 1, wherein the selector is a threshold-type selector, an exponential-type selector or a mixed type selector having a threshold characteristic of the threshold-type selector and an exponential characteristic of the exponential-type selector.

4. The memory device according to claim 1, wherein the MTJ is electrically connected to the read word line through a conductive via, and a sidewall of the MTJ is substantially coplanar with a sidewall of the conductive via.

5. The memory device according to claim 1, wherein a first conductive via is electrically connected to the SOT layer and the first terminal of the selector, and a second conductive via is electrically connected to the write word line and a second terminal of the selector.

6. The memory device according to claim 1, wherein a conductive via is electrically connected between the write word line and a first terminal of the selector, and a second terminal of the selector is electrically connected to the SOT layer without a conductive via in between.

7. The memory device according to claim 1, wherein a conductive via is electrically connected between the SOT layer and a first terminal of the selector, and a second terminal of the selector is electrically connected to the write word line without a conductive via in between.

8. The memory device according to claim 7, wherein the selector is formed as a pillar standing on the write word line.

9. The memory device according to claim 7, wherein the selector is in a line shape, and the selector and the write word line extend along the same direction.

10. The memory device according to claim 1, further comprising a bit line, wherein the bit line is electrically connected to the SOT layer, and a portion of the SOT layer on which the MTJ stands is located between a portion of the SOT layer to which the bit line is connected and a portion of the SOT layer to which the selector is connected.

11. The memory device according to claim 10, wherein the MTJ and the read word line are connected to the SOT layer from above the SOT layer, and the bit line, the selector and the write word line are connected to the SOT layer from below the SOT layer.

12. The memory device according to claim 10, wherein the bit line, the MTJ and the read word line are connected to a first surface of the SOT layer from above the SOT layer, and the selector and the write word line are connected to a second surface of the SOT layer from below the SOT layer.

13. The memory device according to claim 10, wherein the bit line is connected to a first surface of the SOT layer from below the SOT layer, and the MTJ, the read word line, the selector and the write word line are connected to a second surface of the SOT layer from above the SOT layer.

14. A memory device, comprising:
   a spin-orbit torque (SOT) layer;
   a magnetic tunnel junction (MTJ), standing on the SOT layer;
   a first word line, electrically connected to the MTJ without a selector in between;
   a second word line, selectively in electrical contact with the SOT layer; and
   a bit line, electrically connected to the SOT layer, wherein a portion of the SOT layer on which the MTJ stands is located between a portion of the SOT layer to which the bit line is connected and a portion of the SOT layer to which the second word line is selectively in electrical contact.

15. The memory device according to claim 14, wherein at least one of the bit line and the second word line extends at a first side of the SOT layer, and the MTJ and the first word line are located at a second side the SOT layer opposite to the first side.

16. A memory circuit, comprising:
   a plurality of magnetoresistive storage units, arranged as an array, and respectively configured to be written by spin-orbit torque;
   a plurality of read word lines, respectively in direct electrical connection with a row of the magnetoresistive storage units;
   a plurality of write word lines, respectively connecting to a row of the magnetoresistive storage units through selectors; and
   a plurality of bit lines, respectively connecting to a column of the magnetoresistive storage units,
   wherein each of the magnetoresistive storage units is connected to the corresponding read word line without a selector in between.

17. The memory circuit according to claim 16, wherein each of the selectors is configured to be turned on only when the corresponding magnetoresistive storage unit is selected to be programmed.

18. The memory circuit according to claim 16, wherein the selectors are respectively a two-terminal selector.

19. The memory circuit according to claim 16, wherein a row of the magnetoresistive storage units are configured to be selected during a read operation.

20. The memory circuit according to claim 16, wherein one or more in a row of the magnetoresistive storage units is selected during a write operation.

* * * * *